United States Patent
Zhang et al.

(10) Patent No.: US 11,062,780 B1
(45) Date of Patent: Jul. 13, 2021

(54) SYSTEM AND METHOD OF READING TWO PAGES IN A NONVOLATILE MEMORY

(71) Applicant: SanDisk Technologies LLC, Addison, TX (US)

(72) Inventors: Zhiping Zhang, San Jose, CA (US); Huai-Yuan Tseng, San Jose, CA (US); Jiahui Yuan, San Jose, CA (US); Dengtao Zhao, San Jose, CA (US); Deepanshu Dutta, San Jose, CA (US)

(73) Assignee: SanDiskTechnologies LLC

(*) Notice: Subject to any disclaimer, the term of this patent is extended or adjusted under 35 U.S.C. 154(b) by 0 days.

(21) Appl. No.: 16/729,951

(22) Filed: Dec. 30, 2019

(51) Int. Cl.
*G11C 16/26* (2006.01)
*G11C 11/56* (2006.01)
*G11C 16/04* (2006.01)

(52) U.S. Cl.
CPC .......... *G11C 16/26* (2013.01); *G11C 11/5642* (2013.01); *G11C 11/5671* (2013.01); *G11C 16/0483* (2013.01)

(58) Field of Classification Search
CPC . G11C 16/26; G11C 16/0483; G11C 11/5642; G11C 11/5671
See application file for complete search history.

(56) References Cited

U.S. PATENT DOCUMENTS

| | | | |
|---|---|---|---|
| 6,181,597 B1 | 1/2001 | Nachumovsky | |
| 6,853,586 B2 | 2/2005 | Choy et al. | |
| 6,886,088 B2 | 4/2005 | Andreev et al. | |
| 7,336,532 B2 | 2/2008 | Chen | |
| 7,447,076 B2 | 11/2008 | Mokhlesi | |
| 10,734,077 B1* | 8/2020 | Kamae | G11C 11/5642 |
| 2009/0034351 A1 | 2/2009 | Park et al. | |
| 2009/0196102 A1* | 8/2009 | Kim | G11C 8/08 365/185.11 |
| 2011/0141810 A1* | 6/2011 | Mokhlesi | G11C 11/5642 365/185.03 |
| 2013/0141970 A1* | 6/2013 | Shibata | G11C 16/3427 365/185.02 |
| 2014/0226402 A1* | 8/2014 | Duzly | G11C 16/10 365/185.11 |
| 2016/0260492 A1 | 9/2016 | You | |
| 2017/0365335 A1 | 12/2017 | Wang et al. | |
| 2018/0040353 A1 | 2/2018 | Lee | |
| 2019/0043564 A1 | 2/2019 | Madraswala et al. | |

(Continued)

OTHER PUBLICATIONS

International Search Report and Written Opinion, PCT/US2020/024931, dated Sep. 21, 2020.

*Primary Examiner* — Mushfique Siddique
(74) *Attorney, Agent, or Firm* — Dickinson Wright PLLC; Steven Hurles (57) ABSTRACT

Method(s) and structure(s) for a two-page read operation are described and provide a multiple page read. The two page read operation provides for reading two pages with in a block without reducing the control gates to a low voltage level. The two page read can read the first page using an incrementing voltage level at discrete steps and starting the second page read at the high state for the control gates from the first page read. The second page read then decrements the control gate voltages level through the steps. This should reduce energy consumption. The two-page read operation will also reduce the time as the time period to reset the control gates to a low state are not required in between the page read operations.

20 Claims, 9 Drawing Sheets

(56) References Cited

U.S. PATENT DOCUMENTS

2019/0180823 A1    6/2019  Dak et al.
2019/0348122 A1*  11/2019  Ko .................... G11C 16/0483
2020/0089414 A1*   3/2020  Kojima ................ G06F 3/0659

* cited by examiner

SYSTEM AND METHOD OF READING TWO PAGES IN A NONVOLATILE MEMORY

TECHNICAL FIELD

This disclosure relates to memory systems and methods, and in particular, to memory methods and systems with using a two-page read operation.

BACKGROUND

Memory devices are typically provided as internal, semiconductor, integrated circuits in computers or other electronic devices. There are many different types of memory, including random-access memory (RAM), read only memory (ROM), dynamic random access memory (DRAM), synchronous dynamic random access memory (SDRAM), and flash memory. Reading pages from a memory are performed a discrete operations on after the other. There is a continuing need for improved reading operations that are able to read multiple pages with less energy and time.

SUMMARY

This disclosure relates generally to memory systems and methods that use a two-page read operation. The two page read operation can operate to reduce the number of clock cycles required for two page reads. The control signals can be held at a same state for both page read operations with the changes occurring at the voltage levels for the control gates at the wordlines to read different levels in a multilevel cell in a nonvolatile memory.

An aspect of the disclosed embodiments of the present disclosure includes a non-volatile memory read method that may include reading a first page stored in a memory block with incrementing control voltage steps from a low state to a high state to control a control gate; completing first page read; holding the control gate at the high state upon completing the first page read in the memory block; reading a second page in the memory block with decrementing control voltage steps from the high state to the low state; completing the second page read; and releasing the memory block for further operations.

In an aspect of the present disclosure, the method includes holding the control gate at the high state at the end of the first page read includes waiting a gap time period to transition from reading the first page to reading the second page in a two-page sequential read operation.

In an aspect of the present disclosure, the method includes the gap time period is about one clock cycle.

In an aspect of the present disclosure, the method includes holding a selected select gate drain and an unselected select gate drain at a same level during reading the first page and reading the second page.

In an aspect of the present disclosure, the method includes holding the select gate source a same level during reading the first page and reading the second page.

In an aspect of the present disclosure, the method includes holding the control gate at the high state at the end of the first page read includes waiting a gap time period to transition from reading the first page to reading the second page in a two-page sequential read operation.

In an aspect of the present disclosure, the method includes holding the control gate at the high state upon completing the first page read reduces time between the first page read and the second page read by a ratio of 11:1 relative to a non-sequential two page read operation.

In an aspect of the present disclosure, the method includes reading the first page includes latching read data from the first page to a transfer buffer.

In an aspect of the present disclosure, the present disclosure includes reading the second page includes latching read data from the second page to an auxiliary buffer.

In an aspect of the present disclosure, the present disclosure includes latching the first page data includes transmitting read data from the first page, and after the transmitting read data from the first page, transferring the read data from the second page to the transfer buffer.

An aspect of the disclosed embodiments of the present disclosure include a non-volatile memory read method that may include reading a first page in a memory block with incrementing control voltage steps from a low state to a high state at a first control gate which is at a selected state while holding a second control gate at an unselected level; completing first page read; holding the first control gate at a high, unselected state upon completing the first page read in the memory block and switching the second control gate to a selected state; reading a second page in the memory block with decrementing control voltage steps from a high state to a low state with the second control gates being selected; completing the second page read using the second control gates; and releasing the memory block for further operations.

In an aspect of the present disclosure, the method includes holding the first control gate at the unselected state and switching the second control gate to a selected state includes waiting a gap time period to transition from reading a first page to reading a second page in a two-page sequential read operation.

In an aspect of the present disclosure, an aspect of the disclosure includes the gap time period is about one clock cycle.

In an aspect of the present disclosure, an aspect of the disclosure includes holding a selected select gate drain and an unselected select gate drain at a same level during reading the first page and reading the second page.

In an aspect of the present disclosure, an aspect of the disclosure includes holding the select gate source a same level during reading the first page and reading the second page.

The present disclosure includes memory structures and systems that can perform the above memory read operations.

An aspect of the disclosed embodiments of the present disclosure includes a nonvolatile memory, e.g., NAND memory, which may include a plurality of strings including series-connected multilevel memory cells, a select gate source transistor, a select drain transistor, a control gate connected to each memory cell, the memory cells can be arranged in pages within a memory block and a controller to access the plurality of strings to read data stored in the memory cells. In an example embodiment, the controller is configured to output a read command for a two-page sequential read including a first address for reading a first page of data from the memory cells and a second address for reading a second page of data from the memory cells, the second address being sequential to the first address.

In an example embodiment, the controller is configured to output a first gate control signal to the control gate identified by the first address to step the control gate through more than one level to read data at the corresponding multilevel memory cell.

In an example embodiment, the controller is configured to, after reaching the highest level when reading the first page, hold the control signals at a level for the first page read, and outputting a second gate control signal that starts at the highest level and steps down through levels until the second page of data is read.

In an example embodiment, the controller is configured to, after completion of reading the first page and the second page, output control signals to release the plurality of strings for other memory tasks.

In an example embodiment, the memory includes a transfer buffer to latch the read data from the first page read and to transfer the read data from the first page read for other processing. In an example embodiment, the memory includes an auxiliary buffer to latch the read data from the second page read and to transfer the read data from the auxiliary buffer to the transfer buffer after transfer of the read data from the first page read.

In an example embodiment, the memory includes a controller configured to hold the control gate from which the first page is read at an unselect voltage level after completing the first page read operation and to output the second gate control signal to a group of first page read unselect control gates that are at the unselect high level during the first page read and step the group of first page unselect control gates from the highest level and steps down through levels until the second page of data is read.

In an example embodiment, the memory includes the controller being configured to insert a time gap between the first page read and the second page read.

In an example embodiment, the time gap is at least one clock cycle or less than two clock cycles.

In an example embodiment, the memory includes the controller configured to issue commands to hold a selected select gate drain and an unselected select gate drain at a same level during the first page read and the second page read.

In an example embodiment, the memory includes a controller configured to issue commands to hold the select gate source a same level during reading the first page and reading the second page.

These and other aspects of the present disclosure are disclosed in the following detailed description of the embodiments, the appended claims, and the accompanying figures.

BRIEF DESCRIPTION OF THE DRAWINGS

The accompanying drawings, which are incorporated in and constitute a part of this specification illustrate various aspects of the invention and together with the description, serve to explain its principles. Wherever convenient, the same reference numbers will be used throughout the drawings to refer to the same or like elements.

DETAILED DESCRIPTION

The present disclosure describes embodiments that provide for sequential two-page reads in non-volatile memory. Method(s) and structure(s) for a two-page read operation are described and provide a multiple page read. The two page read operation provides for reading two pages with in a block without reducing the control gates to a low voltage level. The two page read can read the first page using an incrementing voltage level at discrete steps and starting the second page read at the high state for the control gates from the first page read. The second page read then decrements the control gate voltages level through the steps. This should reduce energy consumption. The two-page read operation will also reduce the time as the time period to reset the control gates to a low state are not required in between the page read operations. In some examples, the time between page reads can be reduced by up to about ninety percent, e.g., 11:1. In some examples, a single clock cycle is the only break between reading sequential pages. Many of the control signals are maintained at the same signal state for both the first page read operation and the second page read operation in the sequential tow-page read operation(s) as described herein.

Figure 1:
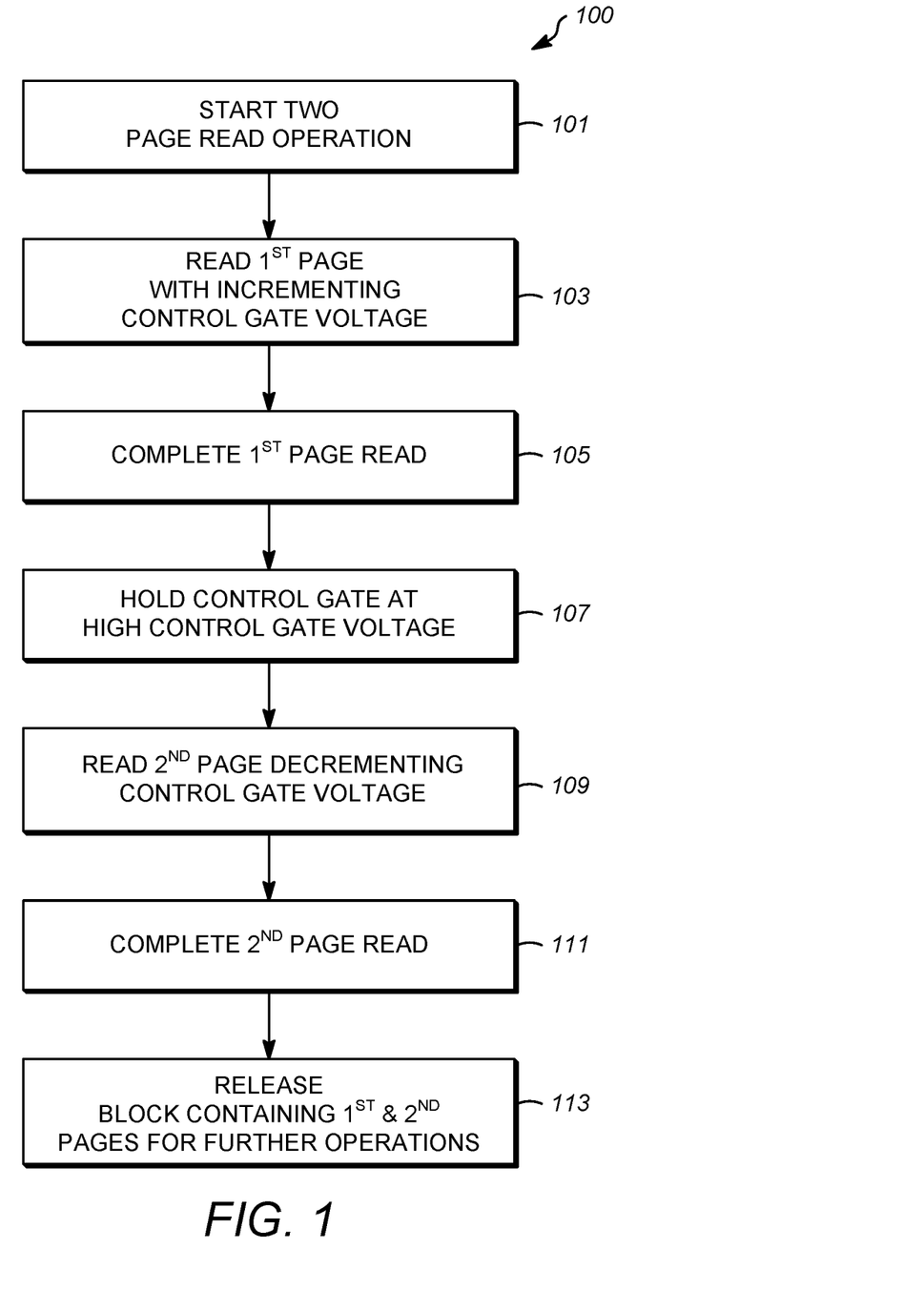
FIG. 1 shows a process for a two page read operation in a nonvolatile memory.

FIG. 1 generally illustrates a flow chart for a two-page read process 100 in nonvolatile memory, e.g., NAND. The reading of NAND nonvolatile (e.g., flash) memory is divided up into equal-sized units, known as "pages". A page is the smallest unit of information that can be read from or written to memory, analogous to a sector on a hard disk drive platter. Chunks of sequential pages are grouped together into "blocks". Individual pages within a block can be read or written in any order, however, in order to rewrite a page the entire block must first be erased. In an example embodiment, the multiple MLCs along a string together form a page that is read during the read operation. The two-page read process 100 provides for an energy savings, which can be beneficial to energy consumption in mobile device, and time savings across reading two pages.

At 101, a two-page read operation begins. The two-page read can be triggered by control circuitry, which can generate control signals on appropriate lines at certain times to trigger a read of a multi-level memory cell. The control circuitry can begin to issue commands, e.g., chip enable (CE#), write enable (WE#), read enable (RE#), command latch enable (CLE), address latch enable (ALE), ready/busy (R/B#) and others. When the CE# signal is asserted, the NAND device will exit standby mode and respond to the control signals. The WE# signal is responsible for clocking data, address, or commands into the NAND. The RE# enables the output data buffers. The CLE signal operates the latch, e.g., when the CLE signal is high, commands are latched into the NAND command register on the rising edge of the WE# signal. The ALE signal operates the address latch register, e.g., when the ALE signal is high, addresses are latched into the NAND address register on the rising edge of the WE# signal. The R/B# signal is asserted low when the NAND device is busy, e.g., this signal is open drain and needs a pull-up resistor.

At 103, the first page of data from the selected MLCs. Reading the value in a multi-level cell (MLC) includes stepping the voltage value through a series of voltage step levels at the control gates, e.g., wordline transistors, at a first page. The value in the MLC is read at each step value.

At 105, the read of a page of stored data from the memory cells is completed.

At 107, the voltage level at the control gates is held at a high value. That is the full range of voltage steps is completed from a low voltage step to a high voltage step. The timing cycles required to drop the voltage from the high level to a low level or ground can be skipped.

At 109, a second page read is started with the voltage at the control gates being at the high voltage step. With the voltage at the control being at the high voltage level at the start, the second page read starts at a high level and decrements the voltage levels from the high voltage level to the low voltage level. The second page read operates on the control gates that are controlled by the same control gate lines and similar control signals thereon, but in a reversed order, e.g., low to high voltage levels and then high to low voltage levels.

At 111, the second page read operation is completed after the low voltage level.

At 113, the block containing the two sequentially read pages can be released for other operations.

Figure 2:
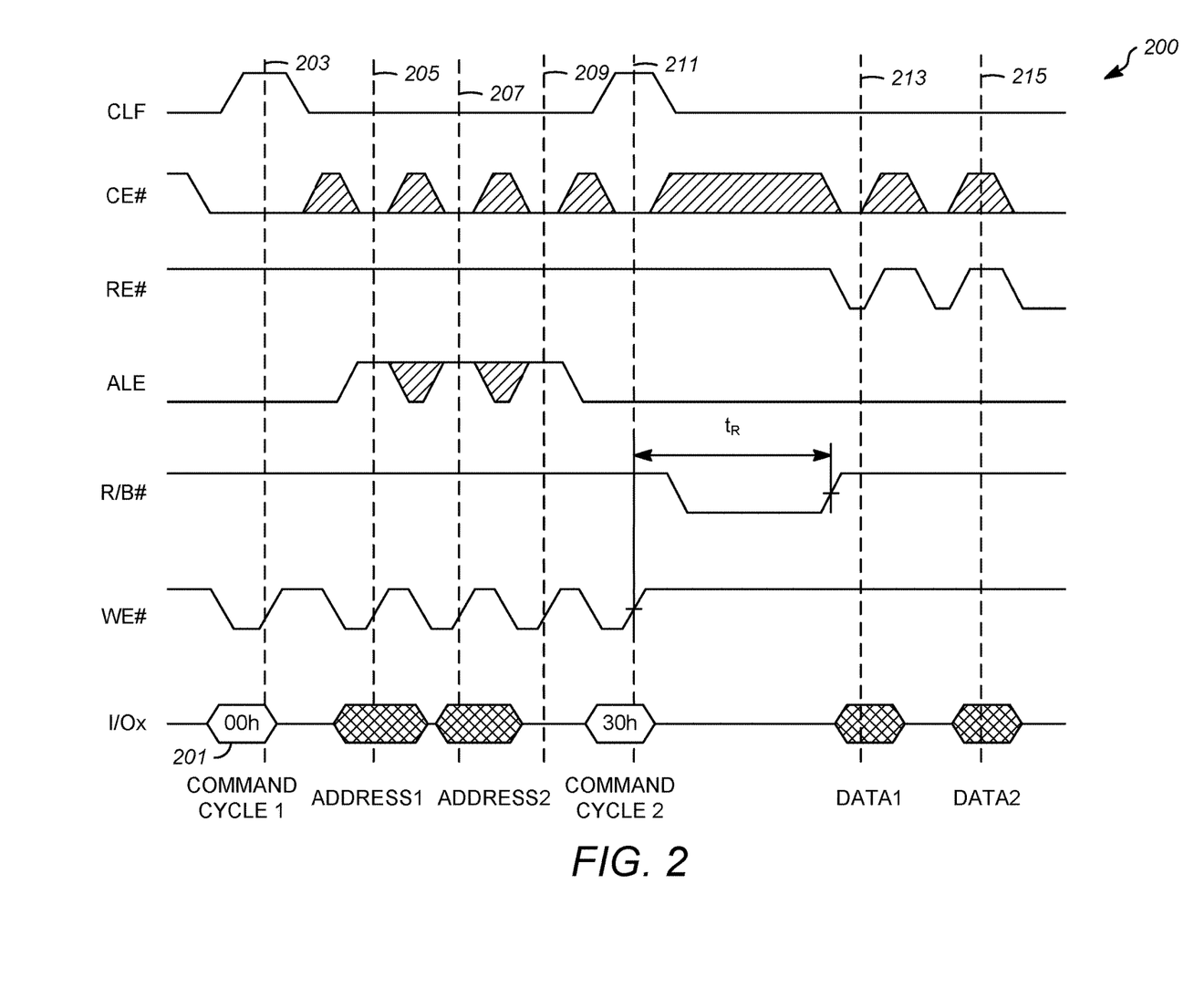
FIG. 2 shows a command timing diagram according to an aspect of the present disclosure.

FIG. 2 shows a timing diagram 200 for command signals for a two-page read according to an aspect of the present disclosure. At time 201 (e.g., ooh), the two page read operation begins with "command cycle 1" at time 203. The CLE signal is high to latch the commands for use in controlling the two-page read operation. The CE# and ALE signals are high at time 203, the RE# and R/B# signals are high. The WE# signal is transitioning from low to high.

At time 205, the first address is being sent to the memory circuitry to read from the first address for the first page. The CLE signal and the CE# signal are both low. The RE# signal, the ALE signal, and the R/B# signal are all at a high level. The I/Ox signal includes the first address, which includes "x" bits. The WE# signal is transitioning from low to high.

At time 207, the second address is being sent to the memory circuitry to read from the second address for the second page. The CLE signal and the CE# signal are both low. The RE# signal, the ALE signal, and the R/B# signal are all at a high level. The I/Ox signal includes the second address, which includes "x" bits. The WE# signal is transitioning from low to high.

At time 209, no additional address is being sent to the memory circuitry. The CLE signal and the CE# signal are both low. The RE# signal, the ALE signal, and the R/B# signal are all at a high level.

At time 211, the wait read time tR begins at the command cycle 2. The CLE signal is high. The CE# signal and the ALE signal are low. The RE# signal and R/B# signal are high. The R/B# signal transitions low during the wait read time tR. The time tR can be the data transfer time from flash array (memory cells in a page) to the page register. As the present read operation is performing a two-page sequential read, there will be two pages of data at times 213, 215 to be read from the page buffers. In an example embodiment, there are two page buffers to store the data read from the memory array.

At time 213, the data read from the first address (e.g., the first page) is stored in a page buffer.

At time 215, the data read from the second address (e.g., the second page) is stored in a page buffer.

Figure 3:
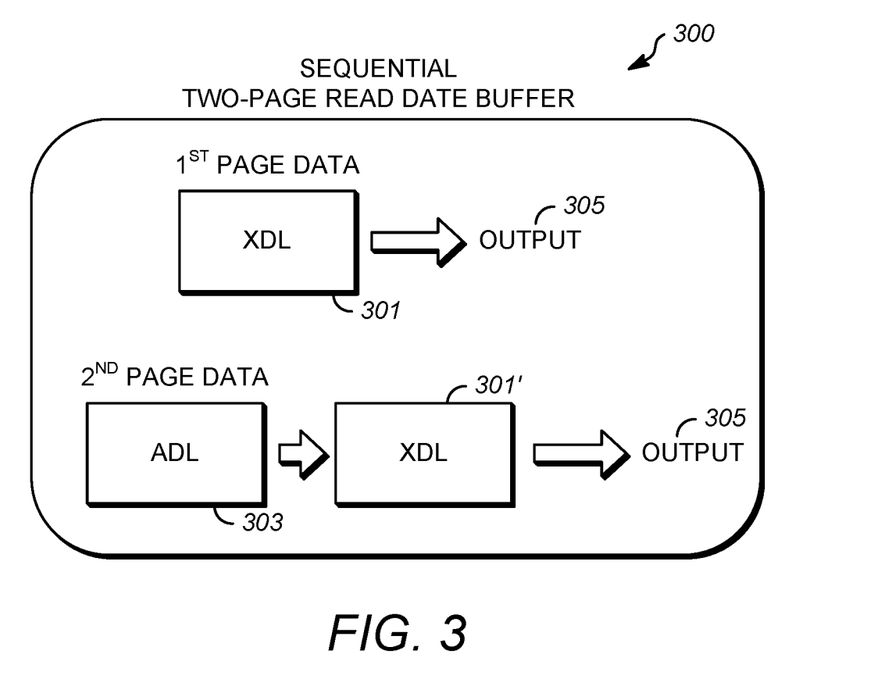
FIG. 3 shows a schematic diagram of a two page read according to an aspect of the present disclosure.

FIG. 3 shows a schematic diagram 300 for a two page read operation according to an aspect of the present disclosure. The diagram 300 represents a memory output structure with a first data buffer, which can store the first page of data at the X data line (XDL) 301. The first page of data can be sent to the output 305, e.g., data lines in the memory system. The memory output structure has a second data buffer 303 that receives the second page of data read in the two-page sequential read operation and stored it in a second, auxiliary data line (ADL) different than the XDL 301, but is in electrical communication to transfer the bits in the page data read from the second page read to the XDL 301. The second page of data is transferred from the ADL 303 to the XDL 301 after the first page is read from the XDL 301. Once the second page of data is transferred to the XDL 301, it is sent to the output 305.

Figure 4:
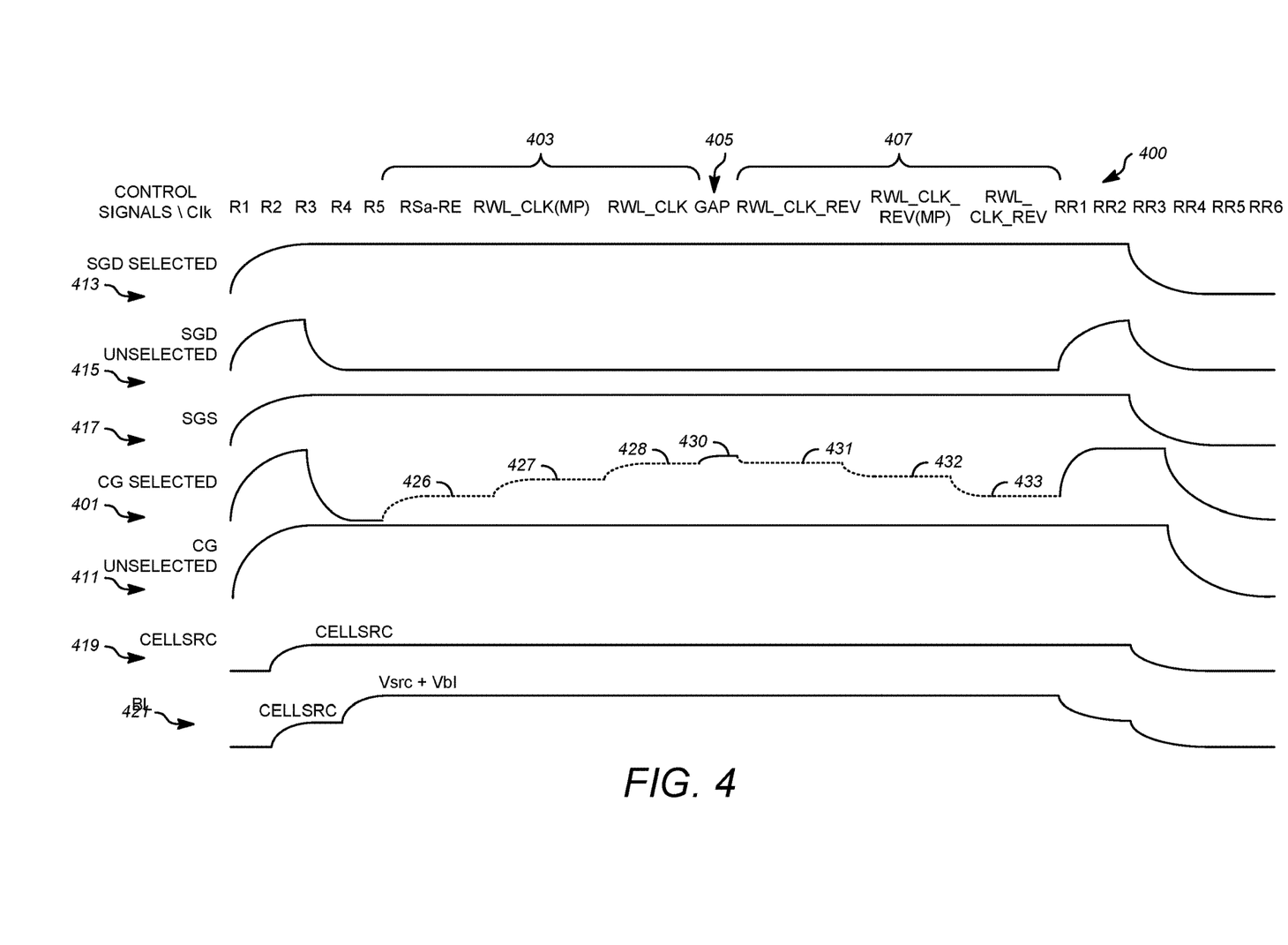
FIG. 4 shows a timing diagram for a two page read operation in a nonvolatile memory according to an aspect of the present disclosure.

FIG. 4 shows a timing diagram 400 for a two page read operation according to an aspect of the present disclosure. The two page read operation is executed in a nonvolatile memory which produces control signals to perform the read operation. The control gate (CG) signal 401 steps the control gate(s) for a page read from a low active level to a high active level during a first page read operation 403. The control gate signal does not drop to the low level before the second page read operation is performed and stays high during the gap time period 405. The second page read operation 407 is performed after the gap time period 405. The control gate signal 401 steps down from the high level to the low level during the second page read operation.

During the read operation, e.g., through both the first page read and the sequentially performed second page read, the unselected control gate signal 411 is held at a high level to disable the control gates that are not being read. The unselected control gate signal 411 transitions from a low state to the high state during clock cycles R1 and R2.

The select gate drain (selected) signal 413 and the select gate drain (unselected) signal 415 are ramped from the low level to the high level during clock cycles R1 and R2. The select gate drain (selected) signal 413 remains at its high level (conducting or "on") during the two-page read operation. The select gate drain (unselected) signal 415 returns to the low level such that the string of memory cells connected to these select gate drain gates are not active to be read. During some conventional operations, non-two page read, the select gate drain signal 413 may transition from high state to a low state between read operations.

The select gate source signal 417 are ramped from a low level to a high level during clock cycles R1 and R2. The select gate source signal 417 remains high (conducting, or "on') during the two page read cycle. This allows electrical signal conduction from the select gate drain through the memory cells (e.g., a NAND string of memory cells, which are transistors) to the select gate source. During some conventional operations, the select gate source signal would transition low and need to be transitioned back to a high, conducting state to read the next page.

The cell select signal (CELLSRC) 419 transitions from a low state to high state over time cycles R2 and R3, and can be delayed through cycle R1. The cell select signal 419 high state can be at about Vsrc, which is less than the high state of the control gate signals 401, 411.

The bitline (BL) signal 421 also transitions from a low state to high state over time cycles R2 and R3, and can be delayed through clock cycle R1. After time cycle R3, the bitline signal can transition to another high state greater than Vsrc, e.g., Vsrc plus Vbl. The bitline signal 421 is held at this high level through the first page read 403 and the second page read 407.

A more detailed explanation of the operation of the control gate selected 401 is described to further elaborate on its states for a two-page read operation. The control gate selected signal 401 ramps to its highest level over the clock cycles R1 and R2 and then drops down to a low state over clock cycles R3, R4. The control gate signal 401 then begins its stepped voltage signal level to read the binary data in the multilevel memory cell that is addressed by the specific control gate signal. The control gate signal is supplied to successive control gates at a certain level in the integrated circuit structure forming the nonvolatile memory, e.g., NAND. The first voltage level 426 is greater than the preceding low voltage level, which can be zero volts. The first voltage level 426 is held for the clock cycles R5a through RE (read enable). In an example embodiment, the ramping up of the signal 401 takes about one clock cycle and the read operation (R5a-RE) is greater than one complete clock cycle, here shown as more than two clock cycles. This first bit can be read during the read operation time R5a-RE. The second voltage level 427 is greater than the preceding, first voltage level 426. The second voltage level 427 is held for at least two clock signals. The ramp up and hold for read time RWL_CLK(MP) is shown as about three clock cycles. In an example embodiment, the ramping up of the signal 401 over a time to reach level 427 takes about one clock cycle and the read operation is greater than one complete clock cycle, here shown as more than two clock cycles. At level 427, the second bit from the same multilevel memory cell can be read. The third voltage level 428 is greater than the preceding, second voltage level 427. The third voltage level 428 is held for at least two clock signals. The ramp up and hold for read time RWL_CLK is shown as about three clock cycles. In an example embodiment, the ramping up of the signal 401 over a time to reach level 428 takes about one clock cycle and the read operation is greater than one complete clock cycle, here shown as more than two clock cycles. At level 428, the third bit from the same multilevel memory cell can be read.

After the control gate selected signal 401 completes the highest level read operation, here, level 428. A gap time period 405 is intermediate the first page read 403 and the start of the second page read 407. The gap time period 405 allows the control circuitry the chance to raise the voltage level of the control gate selected to above the highest read state, e.g., voltage level 428. The gap time period and charging the control gate to above the highest level ensures that the voltage level throughout the line and two multiple selected control gates, e.g., an entire wordline, is at a level at least at the highest read voltage level or slightly above to account for any current leakage. The gap time period 405 is one clock cycle or less. This is due to the other control signals staying at the same levels to read the multilevel cells over different pages. In an example, the select gate drain signals, 413, 415, the select gate source signals 417, the control gate unselected 411, the cellSRC 419, and the bitline 421 all stay at the same level during the two page read. This is unlike conventional reads in which at least one of these signals changes, and in some examples all of these signals change.

After the gap time period 405, the signal 405 operates a second page read 407 but starting from the opposite level, e.g., the high level, relative to the first page read 403. The control gate selected signal 401 is at its highest level 430 and drops its voltage level over discrete step levels during the second page read to read the binary data in the multilevel memory cell that is addressed by the specific control gate signal. The control gate signal 401 is supplied to successive control gates at a certain level in the integrated circuit structure forming the nonvolatile memory, e.g., NAND. The fourth voltage level 431 9first voltage level for the second page read operation 407) is less than the preceding highest voltage level at the gap time. The fourth voltage level can be the same voltage as the third voltage level. The fourth voltage level 431 is held for the clock cycles RWL_CLK rev. In an example embodiment, the decline of the signal 401 takes about one clock cycle and the read operation in RWL_CLK rev is greater than one complete clock cycle, here shown as more than two clock cycles. This fourth bit can be read during the read operation time RWL_CLK rev. The fifth voltage level 432 is less than the preceding, fourth voltage level 431. The fifth voltage level 432 is held for at least two clock signals. The ramp down and hold for read time RWL_CLK rev(MP) is shown as about three clock cycles. In an example embodiment, the ramping down of the signal 401 over a time to reach level 432 takes about one clock cycle and the read operation is greater than one complete clock cycle, here shown as more than two clock cycles. At level 432, the second bit from the same multilevel memory cell can be read. The sixth voltage level 433 is greater than the preceding, second voltage level 432. The sixth voltage level 433 is held for at least two clock signals. The ramp down and hold for read time RWL_CLK rev is shown as about three clock cycles. In an example embodiment, the ramping down of the signal 401 over a time to reach level 433 takes about one clock cycle and the read operation is greater than one complete clock cycle, here shown as more than two clock cycles. At level 433, the third bit from the same multilevel memory cell can be read.

Figure 5:
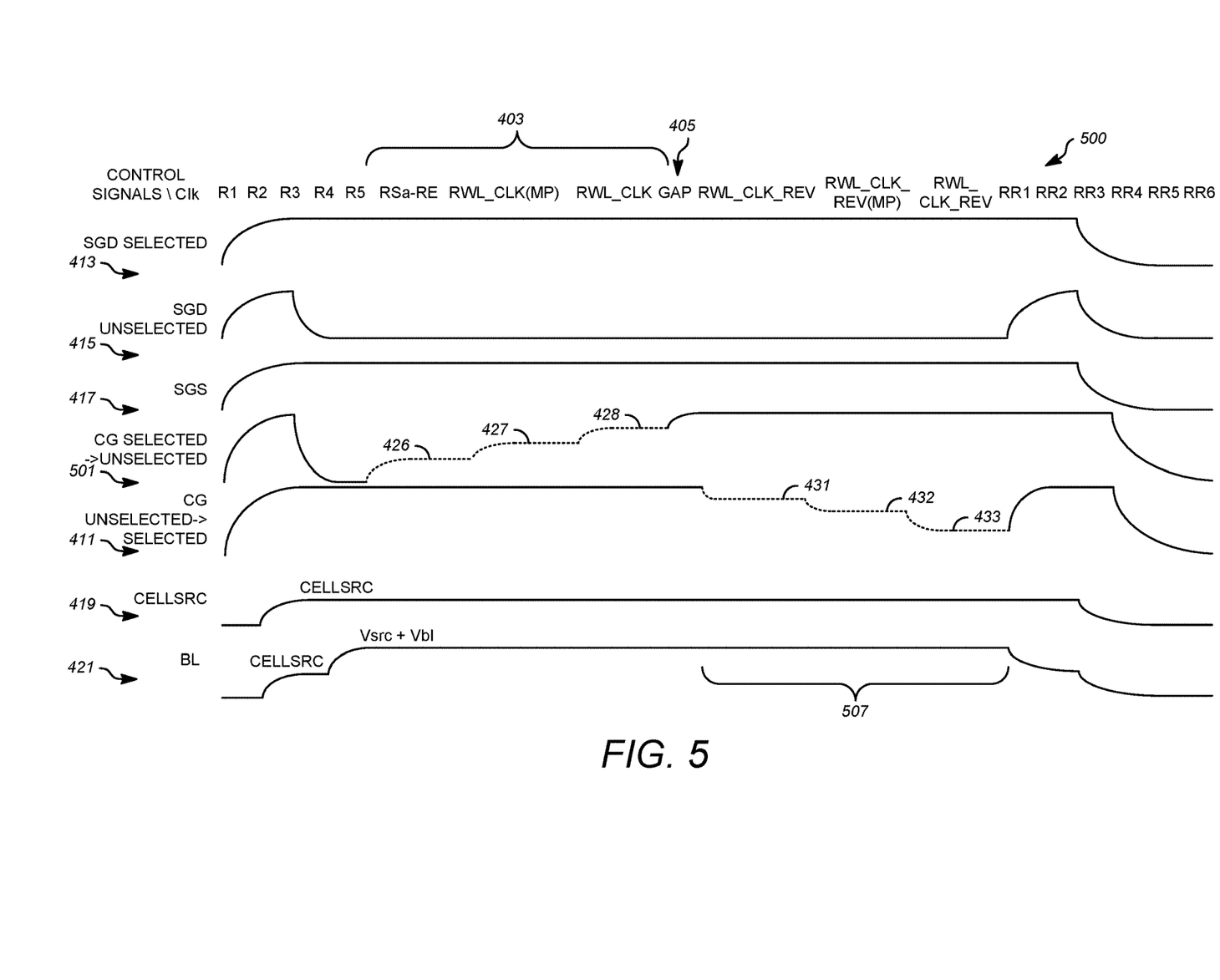
FIG. 5 shows a two page read operation in a nonvolatile memory according to an aspect of the present disclosure.

FIG. 5 shows a schematic diagram 500 for a two page read operation according to an aspect of the present disclosure. The two-page read operation in timing diagram 500 is similar to that shown in timing diagram 400 with similar elements designated by similar reference number. However, the use of the control gate signals 501, 511 are different which results in different control gates being read during the first read operation 403 relative to the second read operation 507. For clarity sake, the description will focus on the difference in timing diagram 500 relative to timing diagram 400. During the first page read operation 403, the control gate signals 501 operate the same as control gate, selected, signals 401 in diagram 400. Likewise during the first page read operation 403, the control gate signals 511 operate the same as control gate, unselected, signals 411 in diagram 400. However, at the gap time period 405 after the first page read 403, the control gate signal 501 transitions from a selected signal to an unselected signal by ramping up to the unselected level, which is at a highest voltage level at the control gate. Stated another way, the first control signal 501 operates as a selected control signal and ramps up toward the highest level during the first page read and then changes to an unselected control gate signal for the second page read 507. The control gate signal 511 transitions from an unselected signal to a selected signal by ramping down from the unselected level, which is at a highest voltage level at the control gate, to a first read level 431. Thereafter, the rad step levels 432, 433 are stepped through to read at each level during the second page read. Stated another way, the second control signal 511 operates as an unselected control signal at the highest level during the first page read and then changes to a selected control gate signal for the second page read 507.

In operation the nonvolatile memory operation shown in timing diagram 400 can operate on the same wordlines whereas the timing diagram 500 can operate on different wordlines. The control gates for the same wordlines in timing diagram 400 step up from a low voltage level read to a high voltage level read on the same wordlines, e.g., the signal at the gate of the selected, active transistor memory cell steps upward and the signal at the non-selected transistor memory cell is held at a high unselect state. The timing diagram 500 shows that after a first group of selected memory cells is read and at a high level, this group is moved to a higher level unselected state and a second group of memory cells is changes from the higher level unselect state to the step down read operation. The timing diagram 500 shows an example embodiment that uses the same step up and step down two page read but across two different groups of wordlines.

Figure 6:
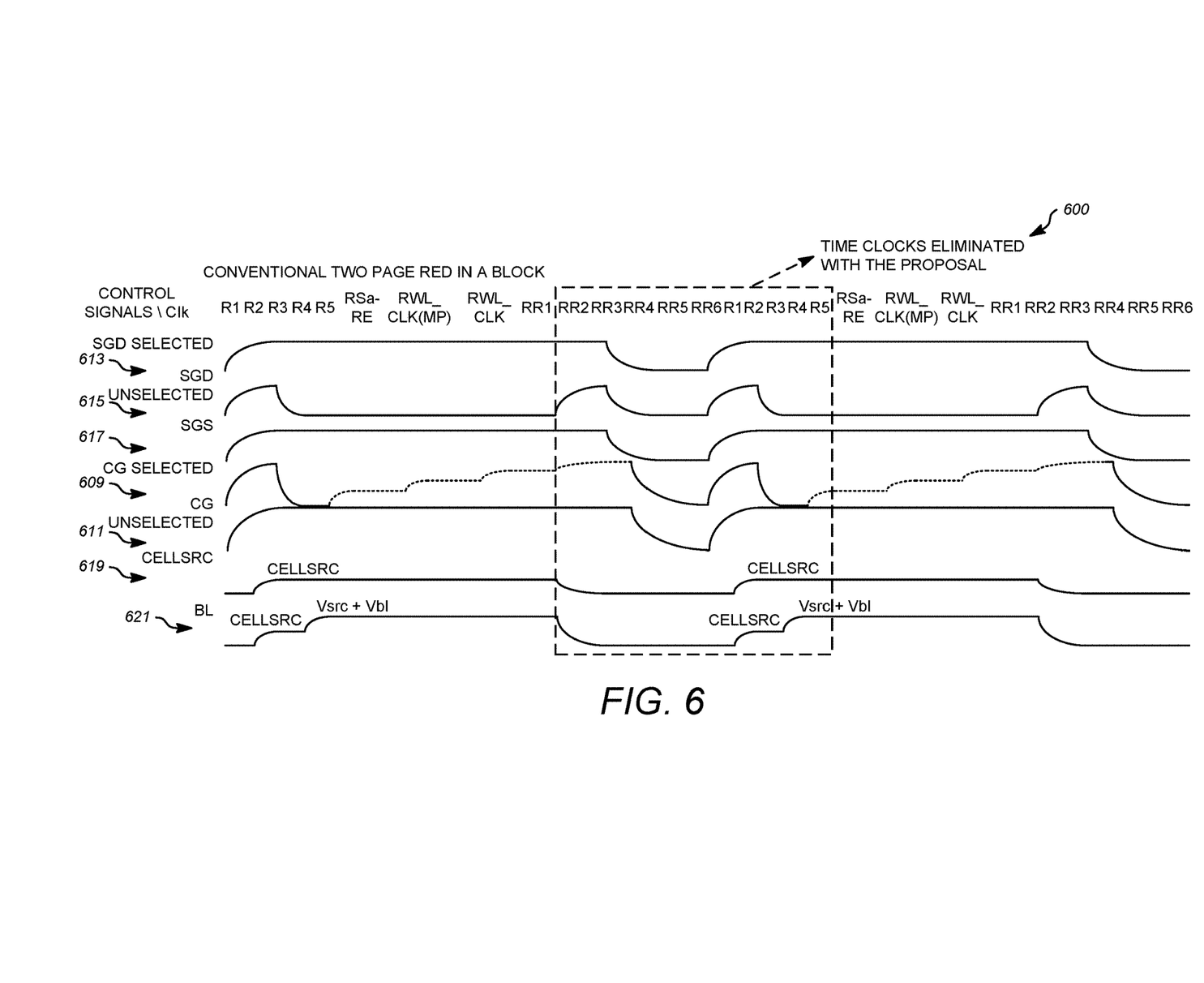
FIG. 6 shows a two page read operation in a nonvolatile memory according to an aspect of the present disclosure.

FIG. 6 shows a schematic diagram 600 for sequential read operations and time clocks that may be reduced or eliminated using a two page read operation as described herein. The schematic diagram 600 can be a traditional read operation. The clock cycles RR1-RR6 and the second batch of R1-R5 can be removed in the presently described two-page sequential read operation. This can be replaced by a gap time period, e.g., the single clock cycle gap time 405. With the clock cycles being equal between the drawings timing diagrams 400. 500 and timing diagram 600, this can be an 11:1 savings, e.g., a savings of ten clock cycles when using the two-page sequential read. This is due to the two-page read operation keeping the SGD selected signal 413 at a high level for two pages of read operation whereas the SDG selected signal 613 transitions at the end of the first read operation and the second read operation. Likewise the other control signals 615, 617, 601, 611, 619 and 621 all transition during the clock in the time period between the two non-sequentially read operations, e.g., during RR1-RR6 and the second batch of R1-R5. Using the two-page sequential read invention described herein can use 90% less time during the time intermediate reading two sequential pages.

Figure 7:
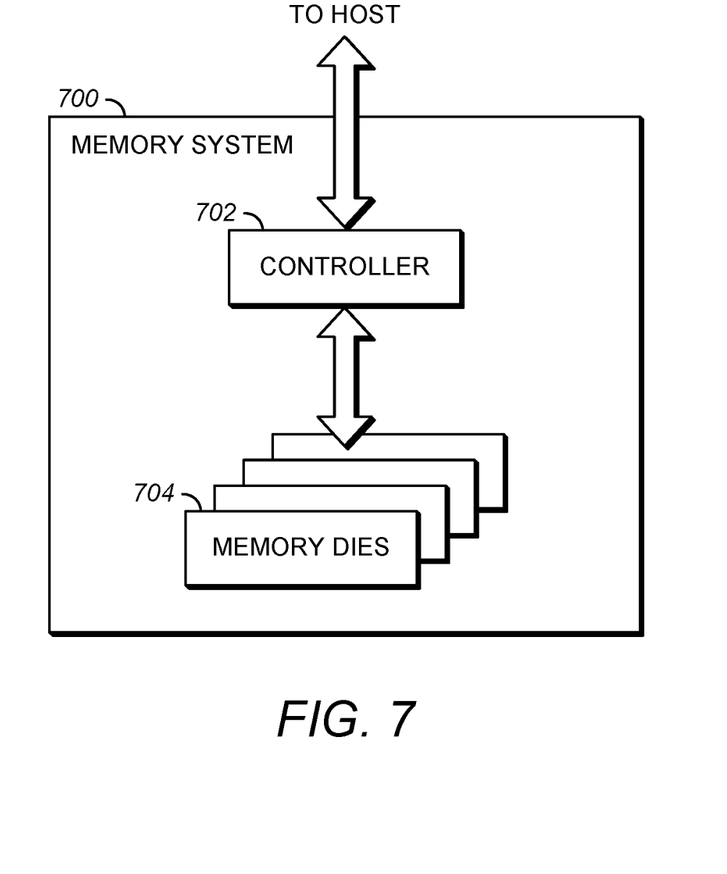
FIG. 7 generally illustrates a block diagram of an example memory system according to an aspect of the present disclosure.

FIG. 7 generally illustrates a block diagram illustrating a memory system 700. The memory system 700 may include a controller 702 and memory that may include or be made up of one or more memory dies 704. The controller 702 can select a two-page sequential read operation as described herein and can trigger the control signals in the timing diagrams 400, 500 to perform the two-page sequential read operation. In some use cases, the controller 702 can perform a traditional read operation as shown in timing diagram 600 and then trigger the two-page sequential read operation 400, 500 when the controller knows it reading from sequential pages. This can be determined by the addresses of the data being requested being sequential. The controller 702 can perform a compare to determine or it knows that the data that begins at the first address of the first page is the start of sequentially stored data. As used herein, the term die refers to the set of memory cells, and associated circuitry for managing the physical operation of those memory cells, that are formed on a single semiconductor substrate. The controller 702 may interface with a host system and transmit command sequences for read, program, and erase operations to the non-memory die(s) 704.

The controller 702 (which may be a flash memory controller) can take the form of processing circuitry, a microprocessor or processor, and a computer-readable medium that stores computer-readable program code (e.g., software or firmware) executable by the (micro)processor, logic gates, switches, an application specific integrated circuit (ASIC), a programmable logic controller, and an embedded microcontroller, for example. The controller 702 can be configured with hardware and/or firmware to perform the various functions described herein and generally illustrated in the timing diagrams, e.g., diagrams 400, 500, 600. For example, the controller can control the erase verify signal levels and the soft erase signal levels on the odd and even wordlines in the non-volatile memory. Additionally, or alternatively, some of the components shown as being internal to the controller can also be stored external to the controller, and other components can be used. Additionally, or alternatively, the phrase "operatively in communication with" could mean directly in communication with or indirectly (wired or wireless) in communication with through one or more components, which may or may not be generally illustrated or described herein.

As used herein, the controller 702 is a device that manages data stored in the memory die(s) and communicates with a host, such as a computer or electronic device. The controller 702 can have various functionality in addition to the specific functionality described herein. For example, the controller 702 can format the memory dies 704 to ensure the memory dies 704 are operating properly, map out bad flash memory cells (e.g., by using the erase verify operations as described herein), and allocate spare cells to be substituted for future failed cells. Some part of the spare cells can be used to hold firmware to operate the controller 702 and implement other features. In operation, when a host needs to read data from or write data to the memory die(s) 704, the host will communicate with the controller 702. If the host provides a logical address to which data is to be read/written, the controller 702 can convert the logical address received from the host to a physical address in the memory die(s) 704. (Alternatively, the host can provide the physical address). The controller 702 can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused). The controller 702 can also control the erase verify operation as described herein. The memory die 704 includes the inhibit bit lines and the program bit lines as described herein.

The interface between the controller 702 and the non-volatile memory die(s) 704 may be any suitable interface, such as flash interface, including those configured for Toggle Mode 200, 400, 800, 1000 or higher. For some example embodiments, the memory system 700 may be a card-based system, such as a secure digital (SD) or a micro secure digital (micro-SD) card. In alternate example embodiments, the memory system 700 may be part of an embedded memory system.

In the example illustrated in FIG. 7, the memory system 700 is generally illustrated as including a single channel between the controller 702 and the non-volatile memory die(s) 704. However, the subject matter described herein is not limited to memory systems having a single memory channel. For example, in some memory systems, such as those embodying NAND architectures, 2, 4, 8 or more channels may exist between the controller 702 and the memory die(s) 704, depending on controller capabilities. In any of the embodiments described herein, more than a single channel may exist between the controller and the memory die(s) 704, even if a single channel is shown in the drawings.

Figure 8:
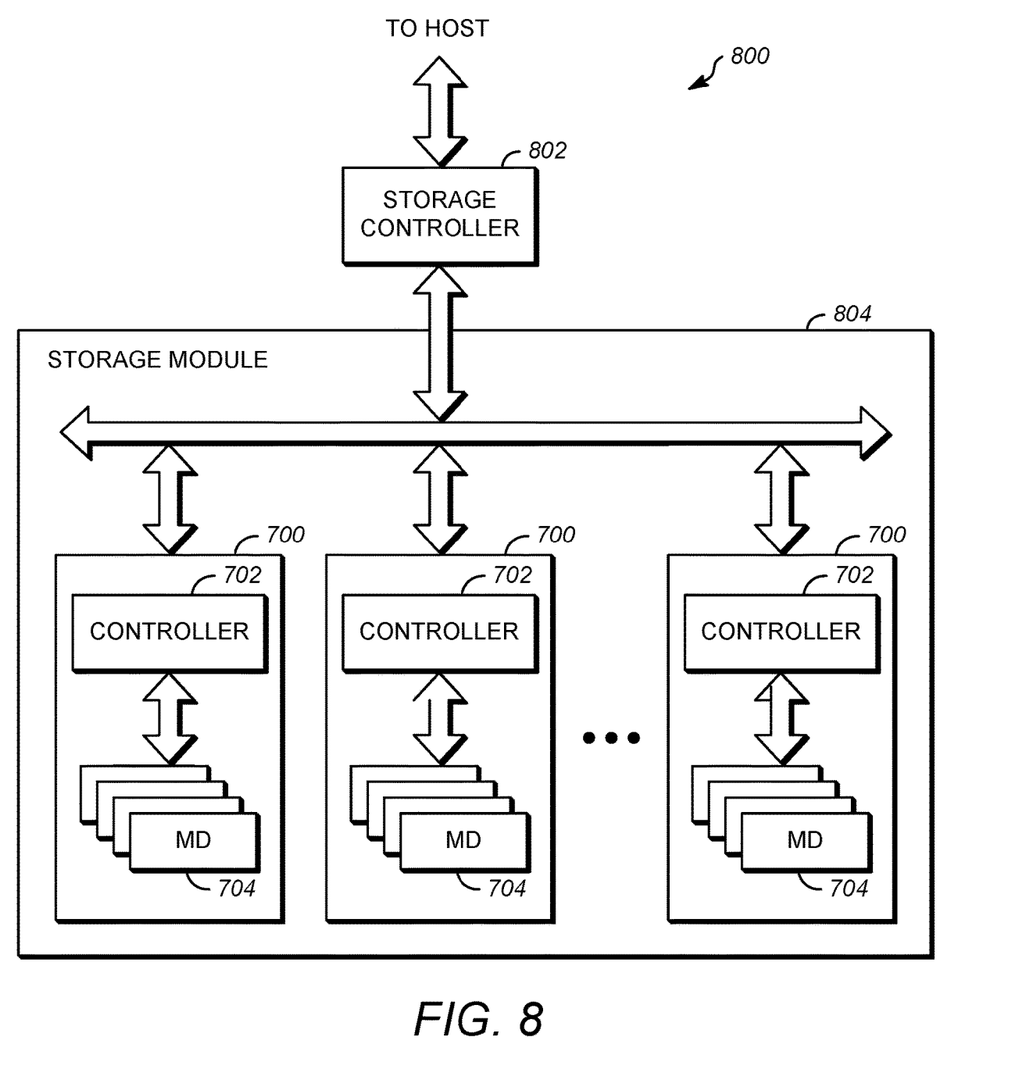
FIG. 8 generally illustrates a block diagram of an example storage module that includes a plurality of memory systems according to an aspect of the present disclosure.

FIG. 8 illustrates a storage module 800 that includes a plurality of non-volatile memory systems 700, each of which can individually preform the two-page sequential rad operation. As such, the storage module 800 may include a storage controller 802 that interfaces with a host and with a storage system 804, which includes a plurality of non-volatile memory systems 700. The interface between the storage controller 802 and non-volatile memory systems 400 may be a bus interface, such as a serial advanced technology attachment (SATA), a peripheral component interface express (PCIe) interface, an embedded Multimedia Card (eMMC) interface, a SD interface, or a Universal Serial Bus (USB) interface, as examples. The storage module 800, in one embodiment, may be a solid-state drive (SSD), such as found in portable computing devices, such as laptop computers and tablet computers, and mobile phones.

Figure 9:
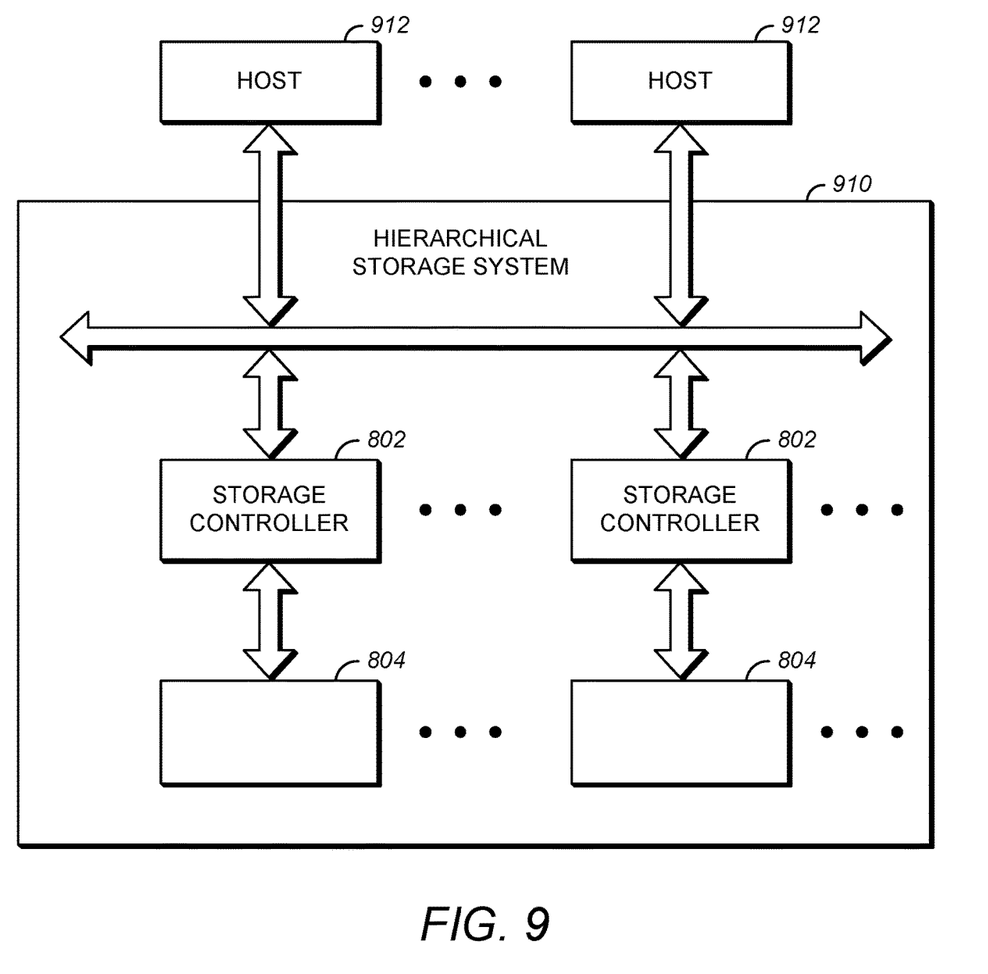
FIG. 9 generally illustrates a block diagram of an example hierarchical storage system.

FIG. 9 is a block diagram illustrating a hierarchical storage system 910. The hierarchical storage system 910 may include a plurality of storage controllers 802, each of which control a respective storage system 804. Host systems 912 may access memories within the hierarchical storage system 910 via a bus interface. Example bus interfaces may include a non-volatile memory express (NVMe), a fiber channel over Ethernet (FCoE) interface, an SD interface, a USB interface, a SATA interface, a PCIe interface, or an eMMC interface as examples. In one embodiment, the storage system 910 illustrated in FIG. 9 may be a rack mountable mass storage system that is accessible by multiple host computers, such as would be found in a data center or other location where mass storage is needed.

The memory system as described herein may include a memory cell structure that includes a plurality of memory cells, otherwise or interchangeably referred to as memory elements. A memory cell is an element or component that stores a unit of data having an n-bit data value, where n is on or more. Any suitable type of memory can be used for the memory cells of the memory cell structure. As examples, the memory can be dynamic random access memory ("DRAM") or static random access memory ("SRAM"), non-volatile memory, such as resistive random access memory ("ReRAM"), electrically erasable programmable read only memory ("EEPROM"), flash memory (which can also be considered a subset of EEPROM), ferroelectric random access memory ("FRAM"), magnetoresistive random access memory ("MRAM"), phase-change memory ("PCM"), or other elements comprising semiconductor material or other material capable of storing information. Each type of memory may have different configurations. For example, flash memory may be configured in a NAND or a NOR configuration.

The memory can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further, by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory cells may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple cell groups, where the memory cells that are part of the same cell group share a single bias line, such as a single word line or a single bit line, and are accessed or biased as a group. Alternatively, memory cells may be configured so that each element is individually accessible, e.g., a NOR memory array. NAND and NOR memory configurations are exemplary, and memory cells may be otherwise configured.

A plurality of memory cells that form the memory cell structure of a memory die may be located within and/or over a substrate. The substrate may be a wafer over, in which the layer of the memory cells are formed, or it may be a carrier substrate, which is attached to the memory cells after they are formed. As a non-limiting example, the substrate may include a semiconductor and/or be made of a semiconductor material, such as silicon. A plurality of memory cells arranged in two dimensions is referred to as a two-dimensional (2-D) memory cell structure. A plurality of memory cells arranged in three dimensions is referred to as a three-dimensional (3-D) memory cell structure. In a three-dimensional memory cell structure, the memory cells are arranged so that memory cells occupy multiple planes or multiple memory device levels (e.g., multiple x-y direction planes), thereby forming a structure in three dimensions (i.e., in the x, y and z directions, where the z direction is substantially perpendicular to and the x and y directions are substantially parallel to the major surface of the substrate). When configured as a three-dimensional memory cell structure, the memory cells extend up or away from the major surface of the substrate. As a non-limiting example, a three-dimensional memory structure may be vertically arranged as a stack of multiple two-dimensional memory device levels. As another non-limiting example, a three-dimensional memory array may be arranged as multiple vertical columns (e.g., columns extending substantially perpendicular to the major surface of the substrate, i.e., in the z direction) with each column having multiple memory cells in each column. The columns may be arranged in a two-dimensional configuration, e.g., in an x-y plane, resulting in a three-dimensional arrangement of memory cells, with the memory cells on multiple vertically stacked memory planes. Other configurations of memory cells in three dimensions can also constitute a three-dimensional memory array.

Additionally, or alternatively, the memory cells of a block or of the memory cell structure generally, are configured to store data as bits or binary digits, with each bit having either a logic 0 or a logic 1 binary value. A single memory cell may be configured to store either a single bit or a plurality of bits. A bit or bits that a single memory cell stores is referred to as a data value. Otherwise stated, a data value is an n-bit binary value that a single memory cell stores, where n is the number of bits of the binary value, and where the number n is one or more. The number of possible data values that a single memory cell can store depends on the n-number of bits it is configured to store. In particular, the number of possible data values a single memory cell can store is $2^n$.

Memory cells may be referred to as single-level cells or multi-level cells depending on the number of bits they are configured to store. A single-level cell, referred to as a SLC cell (or just SLC), is a memory cell configured to store a single or one bit of data. A multi-level cell, referred to as a MLC cell (or just MLC), is a memory cell configured to store multiple (i.e., two or more) bits of data. Example numbers of bits that an MLC cell can store include two, three, or four, although MLC cells that store more than 4 bits may be possible. In general, certain collections of memory cells are configured to store the same number of bits. For example, memory cells that are part of the same word line cell group, part of the same block, or part of the same memory cell structure, are configured to store the same number of bits. In this context, a given collection of memory cells (e.g., memory cells of the same word line cell group, the same block, the same memory cell structure, etc.) stores data on a bits-per-cell basis. Each memory cell of the given collection stores the same number of bits-per-cell. A plurality of these bits all in a NAND string at a certain level can be a page.

At least for NAND memory technology, the NAND memory cells may be configured to store data in accordance with one of multiple different storage schemes, with each storage scheme associated or identifying a different number of bits-per-cell. In at least some example configurations, some NAND memory cells may store data according to one storage scheme while other NAND memory cells store data according to a different storage scheme. Accordingly, two different collections of NAND memory cells located in different memory systems, or in the same memory system but in different dies, planes, blocks, word line layers, or word line cell groups, may store different numbers of bits-per-cell according to different storage schemes. To illustrate, one collection of NAND memory cells may be configured as SLC cells and another collection of NAND memory cells may be configured as MLC cells.

The memory cells store data by being configured in memory states in NAND. As used herein, a memory state is an identifier that identifies a data value of data that a memory cell is storing, can store, or is intended to store. A storage scheme identifies or defines an associated plurality or set of memory states at which a memory cell can be configured. Each memory state identifies, corresponds to, and/or is associated with one of the plurality of data values identified or defined by the storage scheme. Accordingly, a memory cell configured in a given memory state is storing a data value that corresponds to the given memory state. A memory cell can store a different data value by being configured into a different memory state.

For a given storage scheme, the memory states include an erased state and one or more program states. An erased state is a memory state in which a memory cell is configured when erased. For at least some example configurations, the erased state is the memory state that all of a collection of memory cells are in at the start of a program operation to program at least some of the memory cells of the collection. A program state is a memory state that a memory cell is in upon being subjected to a program operation. At a given point in time, a memory cell may be in the erased state or one of the program states.

In addition, the memory as described herein may include a power control circuit that is configured to generate and supply control line voltages (including voltage pulses) to control lines of the memory cell structures. The control line voltages include control gate line voltages supplied to control gate layers, bit line voltages supplied to bit lines, and supply line voltages supplied to supply lines. The control gate line voltages include word line voltages supplied to the word lines, drain select gate line voltages (SGD line voltages) supplied to the SGD lines, and source select gate line voltages (SGS line voltages) supplied to the SGS lines. The power control circuit also be configured to generate and/or supply voltages other than the control lines voltages, including other voltages that may be supplied to the memory cell structure, the read/write circuits, the sense blocks, and/or other circuit components on the memory die.

The memory devices that use the presently described systems and methodologies can provide an improved read operations by using a single two-page read operation. Embodiments described herein describe a novel read method with which two independent pages of data are read in a block in a single operation. Example methods can increase data throughput and also reduce energy consumption. Data pages of smaller size can be easily combined to form larger pages. The example methods can work on multi-level cell (MLC) with at least two or more bits per cell.

The first read in the operation can be a normal-order read on one page. The control voltage on the selected control gates (e.g., wordlines) goes from step through voltage levels from a low state to a high state in a timely order. For reading the second page, a reverse-order read sequence is used to save time and power because at this point all control gates (e.g., wordlines in the block) are biased at high voltage state. The control voltage on the selected wordlines goes from the high state to the low state in a timely order.

The presently described systems and methods that use the two-page read may provide a power savings by reducing the number of sequences to power up the control gates (e.g., the wordlines) to a high state and reduce the number of clock cycles.

It is intended that the foregoing detailed description be understood as an illustration of selected forms that the invention can take and not as a definition of the invention. It is only the following claims, including all equivalents that are intended to define the scope of the claimed invention. Finally, it should be noted that any aspect of any of the preferred embodiments described herein can be used alone or in combination with one another.

What is claimed is:

1. A non-volatile memory read method, comprising:
reading a first page stored in a memory block with a plurality of incrementing control voltage steps from a low state to a high state to control a control gate;
completing first page read;
holding the control gate at the high state upon until reading of a second page begins;
reading the second page in the memory block with a plurality of decrementing control voltage steps from the high state to the low state;
completing the second page read; and
releasing the memory block for further operations.

2. The method of claim 1, wherein holding the control gate at the high state at the end of the first page read includes waiting a gap time period to transition from reading the first page to reading the second page in a two-page sequential read operation.

3. The method of claim 2, wherein the gap time period is about one clock cycle.

4. The method of claim 1, further comprising holding a selected select gate drain and an unselected select gate drain at a same level during reading the first page and reading the second page.

5. The method of claim 4, further comprising holding the select gate source a same level during reading the first page and reading the second page.

6. The method of claim 5, wherein holding the control gate at the high state at the end of the first page read includes waiting a gap time period to transition from reading the first page to reading the second page in a two-page sequential read operation; and wherein holding the control gate at the high state upon completing the first page read reduces time between the first page read and the second page read by a ratio of 11:1 relative to a non-sequential two page read operation.

7. The method of claim 6, wherein reading the first page includes latching read data from the first page to a transfer buffer, wherein reading the second page includes latching read data from the second page to an auxiliary buffer.

8. The method of claim 7, wherein latching the first page data includes transmitting read data from the first page, and after the transmitting read data from the first page, transferring the read data from the second page to the transfer buffer.

9. A non-volatile memory read method, comprising:
reading a first page in a memory block with a plurality of incrementing control voltage steps from a low state to a high state at a first control gate which is at a selected state while holding a second control gate at an unselected level;
completing first page read;
holding the first control gate at a high, unselected state upon completing the first page read in the memory block until reading of a second page begins and switching the second control gate to a selected state;
reading the second page in the memory block with a plurality of decrementing control voltage steps from a high state to a low state with the second control gates being selected;
completing the second page read using the second control gates; and
releasing the memory block for further operations.

10. The method of claim 9, wherein holding the first control gate at the unselected state and switching the second control gate to a selected state includes waiting a gap time period to transition from reading a first page to reading a second page in a two-page sequential read operation.

11. The method of claim 10, wherein the gap time period is about one clock cycle.

12. The method of claim 9, further comprising holding a selected select gate drain and an unselected select gate drain at a same level during reading the first page and reading the second page.

13. The method of claim 12, further comprising holding the select gate source a same level during reading the first page and reading the second page.

14. A NAND memory, comprising:
a plurality of strings including series-connected multilevel memory cells, a select gate source transistor, a select drain transistor, a control gate connected to each memory cell, the memory cells can be arranged in pages within a memory block;
a controller to access the plurality of strings to read data stored in the memory cells, the controller being configured to:
output a read command for a two-page sequential read including a first address for reading a first page of data from the memory cells and a second address for reading a second page of data from the memory cells, the second address being sequential to the first address;
output a first gate control signal to the control gate identified by the first address to step the control gate through more than one level to read data at the corresponding multilevel memory cell;
after reaching the highest level when reading the first page, hold control signals at a level for the first page read until outputting a second gate control signal starts, and outputting the second gate control signal that starts at the highest level and steps down through a plurality of levels until the second page of data is read; and
after completion of reading the first page and the second page, output control signals to release the plurality of strings for other memory tasks.

15. The memory of claim 14, further comprising a transfer buffer to latch the read data from the first page read and to transfer the read data from the first page read for other processing; and an auxiliary buffer to latch the read data from the second page read and to transfer the read data from the auxiliary buffer to the transfer buffer after transfer of the read data from the first page read.

16. The memory of claim 14, wherein the controller is configured to hold the control gate from which the first page is read at an unselect voltage level after completing the first page read operation and to output the second gate control signal to a group of first page read unselect control gates that are at the unselect high level during the first page read and step the group of first page unselect control gates from the highest level and steps down through levels until the second page of data is read.

17. The memory of claim 14, wherein the controller being configured to insert a time gap between the first page read and the second page read.

18. The memory of claim 17, wherein the time gap is at least one clock cycle.

19. The memory of claim 14, wherein the controller is configured to issue commands to hold a selected select gate drain and an unselected select gate drain at a same level during the first page read and the second page read.

20. The method of claim 19, wherein the controller is configured to issue commands to hold the select gate source a same level during reading the first page and reading the second page.

* * * * *